US009450552B2

United States Patent
Dupuis et al.

(10) Patent No.: US 9,450,552 B2
(45) Date of Patent: Sep. 20, 2016

(54) POWER AMPLIFIER HAVING AN INTEGRATED MICROCONTROLLER

(71) Applicant: Avago Technologies General IP (Singapore) Pte. Ltd., Singapore (SG)

(72) Inventors: Timothy Dupuis, West Lake Hills, TX (US); Eric Kimball, Austin, TX (US); David Bockelman, Dripping Springs, TX (US); Vishnu Srinivasan, Austin, TX (US); Justin Dougherty, Austin, TX (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/647,730

(22) Filed: Oct. 9, 2012

(65) Prior Publication Data

US 2014/0100002 A1     Apr. 10, 2014

(51) Int. Cl.
    *H04B 1/38*           (2015.01)
    *H03G 3/30*           (2006.01)

(52) U.S. Cl.
    CPC .................................. *H03G 3/3042* (2013.01)

(58) Field of Classification Search
    CPC .................................................. H03G 3/3042
    USPC ........ 455/571, 126, 63.1, 67.13, 114.3, 127.1
    See application file for complete search history.

(56) References Cited

U.S. PATENT DOCUMENTS

| | | | | |
|---|---|---|---|---|
| 4,803,440 | A | * | 2/1989 | Hotta et al. ................... 330/145 |
| 5,923,215 | A | * | 7/1999 | Hans ............................. 330/149 |
| 6,084,920 | A | * | 7/2000 | Ferdinandsen ............... 375/297 |
| 7,423,488 | B2 | * | 9/2008 | Hunter et al. ................ 330/289 |
| 7,457,617 | B2 | * | 11/2008 | Adams et al. ................ 455/418 |
| 7,728,661 | B2 | | 6/2010 | Bockelman |
| 7,894,772 | B2 | * | 2/2011 | Aoki ............................ 455/63.1 |
| 8,160,520 | B2 | | 4/2012 | Srinivasan |
| 8,369,804 | B2 | * | 2/2013 | O'Brien et al. ............. 455/126 |
| 2009/0243727 | A1 | | 10/2009 | Bockelman |
| 2011/0086594 | A1 | | 4/2011 | McElwee |

OTHER PUBLICATIONS

U.S. Appl. No. 13/408,007, filed Feb. 29, 2012, entitled, "Low Voltage Operation for a Power Amplifier," by Eric Kimball.

* cited by examiner

*Primary Examiner* — Sanh Phu (57) ABSTRACT

In an embodiment, a power amplifier (PA) includes a signal processing path including gain stages to receive a radio frequency (RF) signal and to output an amplified RF signal, sensors coupled to the signal processing path each to sense a characteristic of operation of the PA, and a microcontroller configured to execute instructions and to receive the operation characteristic(s) and to control one or more parameters of the signal processing path responsive this operation characteristic.

24 Claims, 7 Drawing Sheets

POWER AMPLIFIER HAVING AN INTEGRATED MICROCONTROLLER

BACKGROUND

Wireless devices of many types including cellular telephones, laptop computers, tablet computers and so forth, typically include a separate semiconductor device called a power amplifier (PA) that is configured to receive a radio frequency (RF) signal from a radio transceiver and amplify the power of the RF signal so that it can be radiated out of the system via a load such as a given antenna to enable wireless communication to occur. The transceiver receives various signals from a baseband processor of the system, which processes the transmitted and received data as well as controls various functions of the radio.

As newer wireless communication standards begin to be adopted, greater control of operation is needed to meet various performance requirements. In addition, it is desirable to optimize performance of a PA for various reasons, including improved fidelity of communications as well as reducing power consumption.

For WCDMA and LTE RF power amplifiers it is desired to optimize the PA performance (linearity and efficiency). This is becoming more difficult as new technologies such as average power tracking (APT) and envelope tracking (ET) are deployed with tighter tolerances in order to meet specifications. In APT, the supply voltage of the power amplifier changes depending on the output power control signal which changes significantly slower than the modulation rate. When the supply voltage changes, it tends to change tuning, linearity and other parameters of the PA. With ET, the power supply of the PA tracks the envelope of the RF signal, so that the supply changes faster than the modulation rate. As such additional constraints are imposed on the power amplifier in that, as voltage changes, it is desirable to limit gain and phase changes. Traditionally PA control has been done using simple analog circuitry methods.

DETAILED DESCRIPTION

In various embodiments, a power amplifier (PA) can be configured to include a microcontroller or other programmable logic. As used herein, the term "microcontroller" is understood to mean one or more programmable execution engines configured to execute instructions provided to it from a program storage. Note that a non-programmable or non-updateable logic such as a digital state machine is not considered to be a microcontroller. This integrated microcontroller, along with an onboard programmable memory such as a one-time programmable (OTP) memory, may be used to optimize performance of the PA over a wide range of variables including power supply voltages, temperature and load, among others. Although the scope of the present invention is not limited in this regard, in many implementations the PA may be configured as a single semiconductor die of an integrated circuit (IC), namely a stand alone PA IC. In such embodiments, the microcontroller can be configured on the same die as the remainder of the PA circuitry, along with the programmable memory to enable storage of program instructions for execution by the microcontroller. Also note that the PA may be a complementary metal oxide semiconductor (CMOS)-based PA and as such, the microcontroller and memory can also be configured using CMOS devices.

Note that the characteristics that can be analyzed by the microcontroller are virtually unlimited as to measurable operational characteristics of the PA. In turn, virtually any parameter of the PA that can be adjusted may be controlled via the microcontroller responsive to such analysis. For purposes of example and not for purposes of limitation, in various embodiments flexible control of PA features including bias, tuning, gain, and mode of operation, among many others may be under control of the microcontroller. In addition, these parameters can be controlled responsive to various monitored or sensed information, including power mode, battery voltage, temperature, peak levels, load, and so forth.

Figure 1:
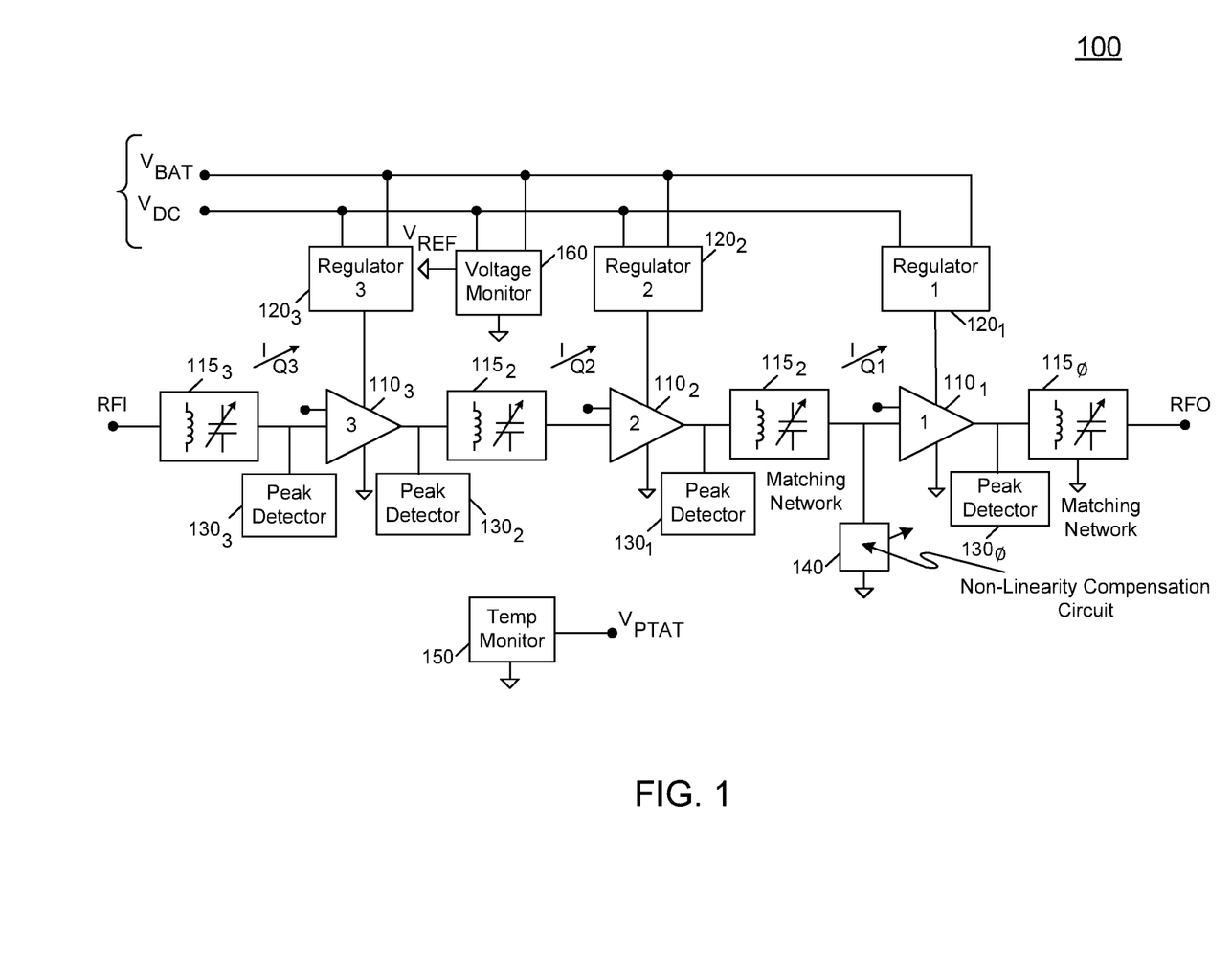
FIG. 1 is a block diagram of a power amplifier in accordance with an embodiment of the present invention.

To illustrate an example power amplifier, reference can be made to FIG. 1, which is a block diagram of a power amplifier in accordance with an embodiment of the present invention. As shown in FIG. 1 PA 100 may be a single chip, single die CMOS PA that can flexibly accommodate different wireless communication standards and can operate at different power levels. As seen in FIG. 1, PA 100 is configured to receive an incoming RF signal (RFI) via a matching network $115_3$ which in an embodiment can be formed as an LC filter including an inductance L and a variable capacitance C. The matched signal output from matching network $115_3$ may be provided to a first power stage $110_3$ which may be formed of one or more metal oxide semiconductor field effect transistor (MOSFET)-based transconductors implemented as a pre-drive stage. In turn this amplified signal output by first stage $110_3$ may be coupled through another matching network $115_2$ to a second gain stage $110_2$ which can be formed of one or more MOSFET-based transconductors. In turn, the amplified output from gain stage $110_2$ may be coupled through another matching network $115_2$ to a final or output gain stage $110_1$, which again may be configured as one or more MOSFET-based transconductors. The resulting amplified signal may be coupled through an output matching network $115_0$ and output as an RF output signal (RFO) to be coupled to a given load, such as an antenna. The matching networks may be made adjustable, typically by providing a variable capacitor. One embodiment of a variable capacitor is a bank of capacitors that can be individually connected or disconnected to the matching network via digital control signals. In such an embodiment, the matching network may receive a plurality of digital control signals, allowing for digital control of the tuning, loss, phase change or other response of the matching network.

FIG. 1 also illustrates various detection mechanisms present within the PA. Specifically, a plurality of peak detectors $130_0$-$130_3$ may be coupled to various points within the signal processing path to obtain peak values of the signal at these portions of the signal path. In addition, a temperature monitor 150 may be present to generate a monitoring signal $V_{PTAT}$ that provides a voltage that is proportional to absolute temperature.

Note that a compensation circuit 140 may be coupled to one or more of the stages. In the specific embodiment shown, a non-linearity compensation circuit 140 may be coupled to an input of output gain stage 110₁. In various embodiments, compensation circuit 140 may provide for non-linear capacitance compensation. Details of this circuitry may be found in U.S. Publication No. 2009/0243727, the disclosure of which is hereby incorporated by reference. And although shown as being coupled to output gain stage 110₁, understand that additional compensation circuits may be coupled to other gain stages of the PA. In such an embodiment, the compensation circuit network may receive a plurality of digital control signals from the microcontroller, allowing for digital control of the compensation circuit, such as the amount of non-linear capacitance compensation.

To power the gain stages of PA 100, a plurality of voltage regulators 120₁-120₃ may be provided. Note that these voltage regulators may operate on one of multiple DC supplies for example, a fixed or variable voltage may be provided, namely a fixed (or very slowly changing) voltage $V_{DC}$, which may be provided from an off-chip voltage regulator, e.g., of a mobile station having the PA. In such applications, there is typically also a connection to a battery voltage ($V_{BAT}$) which may be obtained from a battery of a system including the PA or a similar constant reference voltage. Alternately, all stages of the PA may operate from the battery voltage. One or more of the regulators 120₁-120₃ may be configured to include monitors for the bias current of each stage, namely $I_{Q1}$-$I_{Q3}$. The regulators may be controllable with digital signals, so that the output voltage of each regulator may be set by a microcontroller as described herein. To determine the voltage level that is being received, a voltage monitor 160 may couple to the voltage input lines to thus generate a detection voltage. Other voltage and current monitors may be included as appropriate, such as for various bias voltages, e.g., the output voltages from regulators 120₁, 120₂, and 120₃.

According to various embodiments, the detections performed in PA 100 may be used to provide monitoring information to a microcontroller of the PA (not shown for ease of illustration in FIG. 1). Based on the various monitoring information, which can include peak detection information, temperature information, voltage information, current information, frequency information, and peak/average information (or average RF signal information), different characteristics or parameters of the PA can be controlled. In the embodiment shown in FIG. 1, these parameters may include bias currents. For example, as shown, each gain stage 110₁-110₃ may be configured to receive one or more bias currents, namely $I_{Q1}$-$I_{Q3}$. These bias currents can be configured so that they are digitally controllable. One embodiment has multiple current sources, each of which can be turned on or off with a digital control signal. The outputs of the multiple current sources are coupled together, providing a composite current source with a plurality of digital control signals allowing for digital control of a bias current. These bias currents can be controlled responsive to control signals generated in the microcontroller.

Phase/frequency detectors (PFD) may be included in PA 100 (not shown for ease of illustration). Such phase detectors can be placed across each stage to measure the phase shift of the stage. For example, one input of the PFD can be connected to the input of stage 110₁ and the second input of the PFD can be connected to the output of stage 110₁. The PFD may have an analog output which can be measured by a digitizer (such as an analog-to-digital converter) and provided to the microcontroller so that the phase shift through a stage can be calculated. Additionally, there can be a frequency counter attached to one or more of the blocks, so that the microcontroller can directly calculate the RF signal frequency.

Figure 2:
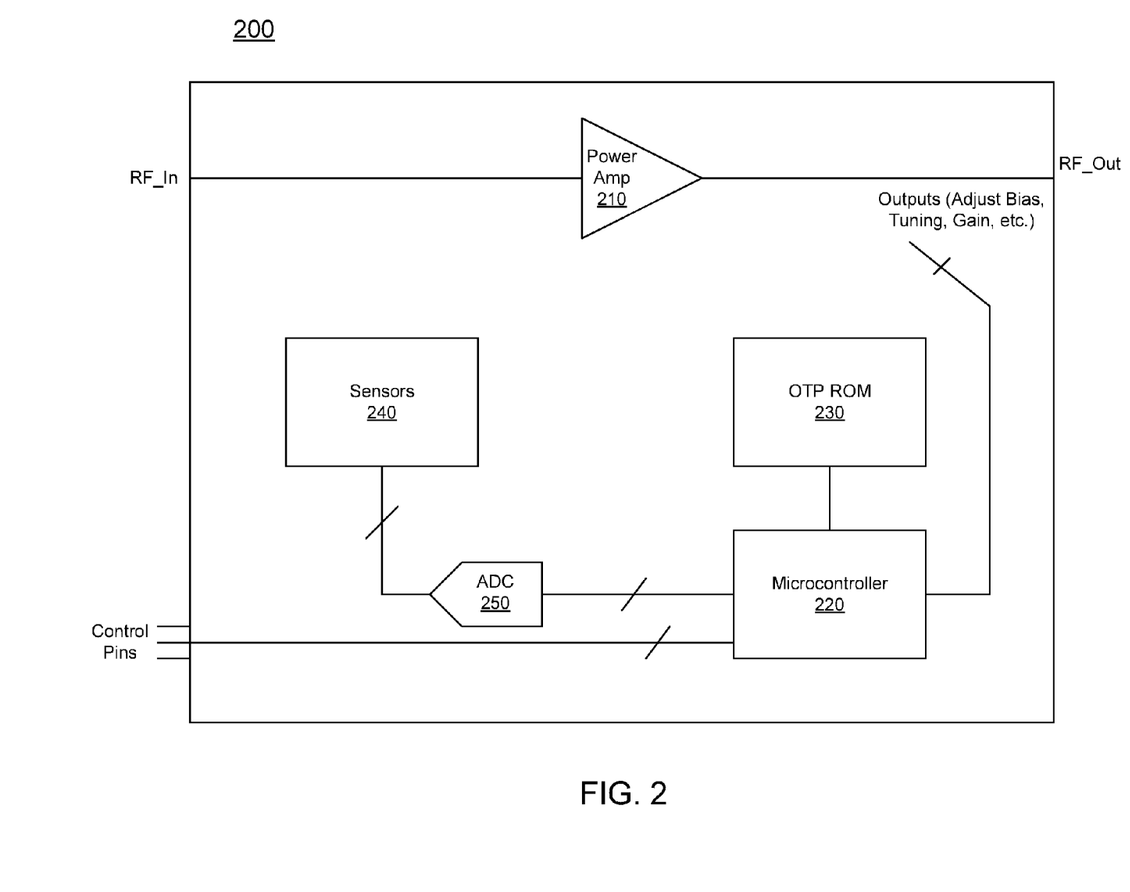
FIG. 2 is a high level block diagram of a PA in accordance with an embodiment of the present invention.

Referring now to FIG. 2, shown is a high level block diagram of a PA in accordance with an embodiment of the present invention. As shown in FIG. 2, PA 200 may be configured as a single die PA. The main PA circuitry, such as the example illustrated in FIG. 1 above is represented by PA 210. In general PA circuitry 210 receives the incoming RF signal, amplifies it and outputs the RF signal to a load.

As further seen in FIG. 2, a microcontroller 220 may be present. In various embodiments, this microcontroller may be of relatively simple arrangement and can be formed as a custom microcontroller. In other embodiments, a standard microcontroller such as an 8051-based microcontroller may be present instead. As seen, microcontroller 220 is coupled to a memory 230, which in an embodiment may be an OTP read-only memory (ROM). In an embodiment, the OTP memory may be of relatively small size, e.g., an eight kilobyte (kB) memory to store both programs and data. By providing this OTP memory, a program to be stored in memory can be modified for each part as a result of final testing. As such, embodiment may be configured to include a non-transitory storage medium in which instructions are stored that enable the microcontroller to perform various control algorithms as described herein. In addition, various algorithms and settings of the program can be determined after manufacture of PA's and thus wide flexibility to provide unique optimizations for different customers is realized. However understand the scope of the present invention is not limited in this regard and other types of non-volatile memories may be present. Still further, it is possible to have a volatile memory store a program for the PA. However, in such an implementation, the operating program would need to be downloaded to the PA on power up of a system including the device.

Note in some embodiments, microcontroller 220 may be a low spur microcontroller to avoid creation of spurs and noise. In various embodiments, a low spur design can be implemented by adjusting or moving clocks of the microcontroller, or the designed circuits can be configured within a shield. In addition the microcontroller can halt itself and enter a sleep mode to later be woken up, either responsive to a programmable level of a sensor or after a predetermined time. As an example, when a trip or trigger point is detected in a sensor, the sensor sends a wake up signal directly to the microcontroller to cause it to wake up and begin initialization.

Still referring to FIG. 2, microcontroller 220 may be configured to receive incoming digital information representative of various monitoring information obtained within the PA. As shown, various sensors 240 may be present, each of which may be coupled to a digitizer such as an analog-to-digital converter (ADC) 250. The sensors can include voltage monitors, current monitors, peak detectors and temperature monitors, as described earlier. In an embodiment, the ADC may be implemented as an eight bit successive approximation register (SAR) ADC to thus provide eight bit digital values to the microcontroller. Of course other implementations are possible with wider or narrower bit widths.

Although not shown in the high level view of FIG. 2, understand that a selection mechanism such as a multiplexer may be coupled between sensors 240 and ADC 250. As further illustrated, various control information received on chip (such as from a baseband processor or another location) may also be coupled to microcontroller 220. This information can be received via control pins, in certain implementations. In an embodiment, such inputs may include an enable signal, and one or more mode control signals to indicate a desired mode of operation. Or a standard low power interface such as a MIPI interface may provide this information. As an example, both the enable signal and the mode control signals may be received from a baseband processor coupled to the PA.

Based on all of the received monitoring information and responsive to the operating program, microcontroller 220 may generate various control signals and provide them to locations within the PA. Although the scope of the present invention is not limited in this regard, such control signals may be used to adjust bias voltages or currents, tuning values, gain values and so forth. In addition, multiple sets of control signals may be provided, each set having different values for different measured values of one or more parameters including power mode, battery voltage, temperature, peak levels (clipping) among other information that can be detected by sensors present in the PA.

Figure 3:
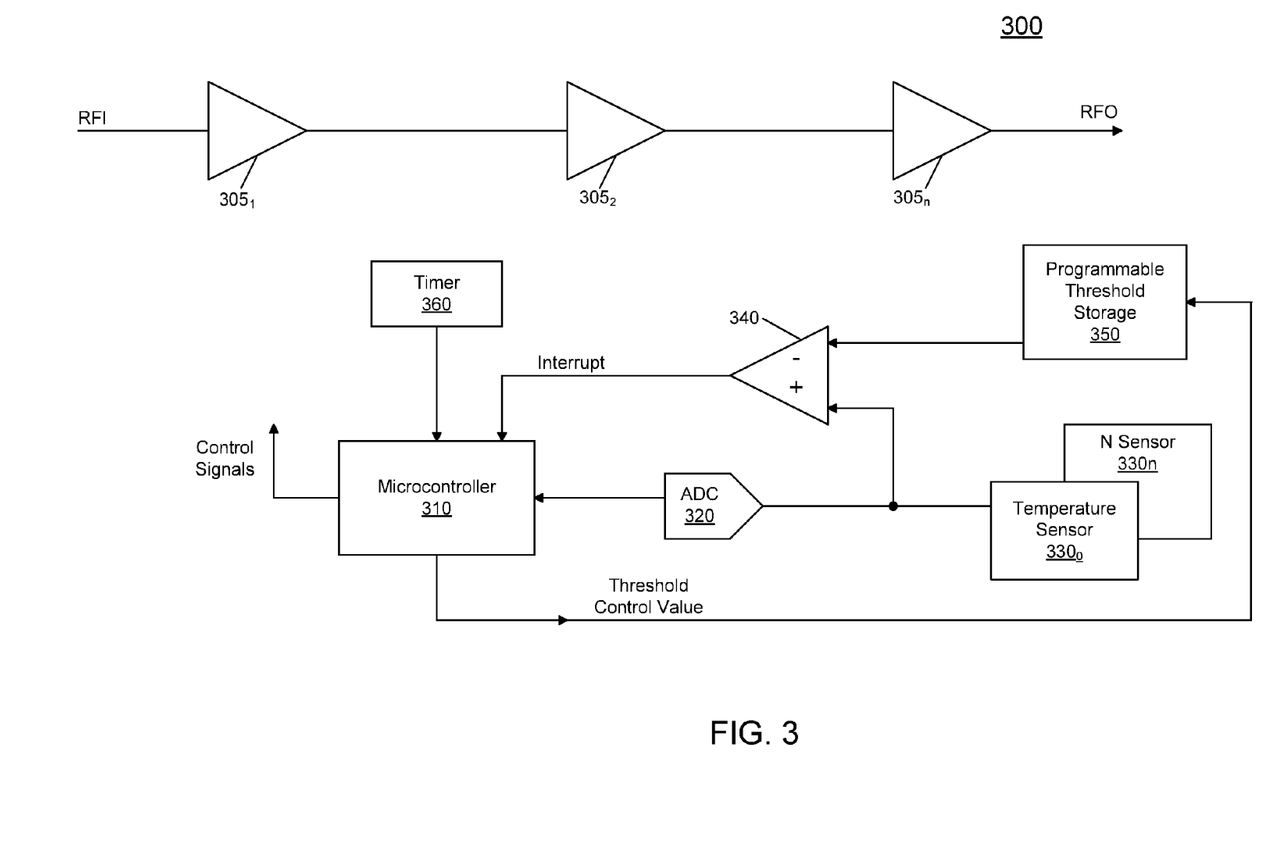
FIG. 3 is a block diagram of an arrangement of a PA in accordance with another embodiment of the present invention.

Referring now to FIG. 3, shown is a block diagram of an arrangement of a PA in accordance with another embodiment of the present invention. As shown in FIG. 3, PA 300 includes a signal processing path having a plurality of gain stages $305_1$-$305_n$. In different implementations, varying numbers of gain stages may be provided. In general, these stages all act to receive an RF signal and amplify it, e.g., by way of pre-driver, driver and output stages. Although not shown for ease of illustration in FIG. 3, understand that various sensors may be configured at different points within the signal processing path.

FIG. 3 further shows various components present in the PA including a microcontroller 310. Microcontroller 310 may provide control signals to various components of the PA based on the inputs it receives. More specifically, sensors $330_0$-$330_n$ may be present. For purposes of illustration one such sensor may be a temperature sensor. Various other sensors described above may also be present. Each of these sensors may output an analog value to an ADC 320. To select which signal to be provided to ADC 320 at a given time, a selection mechanism such as a multiplexer may be coupled between the sensors and ADC 320 (not shown for ease of illustration). In an embodiment, microcontroller 310 may enable control of the multiplexer to output a given one of the sensor values for digitization in ADC 320 and input to microcontroller 310.

In various embodiments, rather than having microcontroller 310 powered on and active whenever the PA is active throughout all RF communications, in some implementations microcontroller 310 may be powered on responsive to a predetermined time interval (such as once per millisecond), e.g., as determined by a timer 360 and/or responsive to an interrupt signal received when a given sensor output reaches a threshold value. In such embodiments the sensors can act as interrupt sources to the microcontroller so that it need not run all the time. To this end, the sensor outputs may be communicated to an interrupt input to the microcontroller. Other wake up signals may be generated based on a state change to an input pin. Thus if a user changes a mode the microcontroller may wake up to determine whether any control changes are needed to accommodate the new mode.

In the particular implementation shown, a threshold storage 350 may be provided that can be programmed by microcontroller 310. Assume for purposes of discussion that this programmable threshold storage 350 stores a threshold value for temperature received from microcontroller 310. As seen, this value is provided to a comparator 340, which may be received along with the output of temperature sensor $330_0$ (for example). If the PA temperature detected by sensor $330_0$ exceeds this threshold value from threshold storage 350, an interrupt signal can be communicated to microcontroller 310 to enable its power up to handle a potential temperature event. Note that the interrupt signal may be communicated with an indication of the sensor with which it is associated. Or in an implementation in which multiple interrupt inputs to the microcontroller are available, each interrupt signal generated responsive to an event occurring as to a given sensor can thus couple to a given input. Although only a single threshold storage and comparator are shown, understand that multiple such components may be present, each for a corresponding sensor. Or only the single sensor may be present and multiplexed to receive different threshold and comparison values.

By combining inputs from multiple sensors, the microcontroller can compute various key performance parameters for various blocks of the PA. For example, the gain of stage $110_1$ can be calculated by measuring the peak voltage via a peak detector connected to the output of the stage, measuring the peak voltage via a peak detector connected to the input of the stage and computing the ratio of the voltages. Also, in some embodiments, the PA can determine frequency or channel within the band. Then settings can be adjusted based on the channel. For example, the different matching networks can be tuned by changing one or more control signals, which changes the tuning. For this frequency determination the PFD output can be measured and the frequency calculated, allowing the tuning of a corresponding matching network to change by a known amount. As these are modulated signals, multiple measurements can be made or the average RF amplitude can be used instead of the peak. Alternately, the performance of a matching network can be adjusted to a target level. For this determination, a peak voltage can be measured via a peak detector connected to a corresponding matching network. The tuning of the network can be adjusted by a known amount, and the peak voltage re-measured. The difference between the two measurements can give an indication of where the frequency is relative to the factory tuned frequency, providing an estimate of the signal frequency.

By combining phase shift information from a PFD and the peak voltage from a gain stage, the load impedance can be calculated by the microcontroller. This calculated load impedance may allow adjustment in various circuits to allow improved PA performance. For example, when the load to stage $110_1$ is calculated to be lower than a nominal value, the microcontroller can increase the bias current in stage $110_1$ by an amount programmed in a stored algorithm.

The microcontroller can also provide calibration of the various sensors. This calibration can be made by storing correction factors in the on-board programmable memory. The correction factors can be derived from nominal design or through direct measurement during PA test. For example, the peak voltage detector outputs can be calibrated through a simple equation $V_{corr}=a_2*V_{meas}^2+a_1*V_{meas}+a_0$. In an embodiment, $a_0$-$a_2$ are coefficients that can be stored in microcode stored in the on-board memory or loaded into the OTP memory at production testing. In such a way, the microcontroller can be programmed to correct the value of each voltage detector.

Figure 4A:
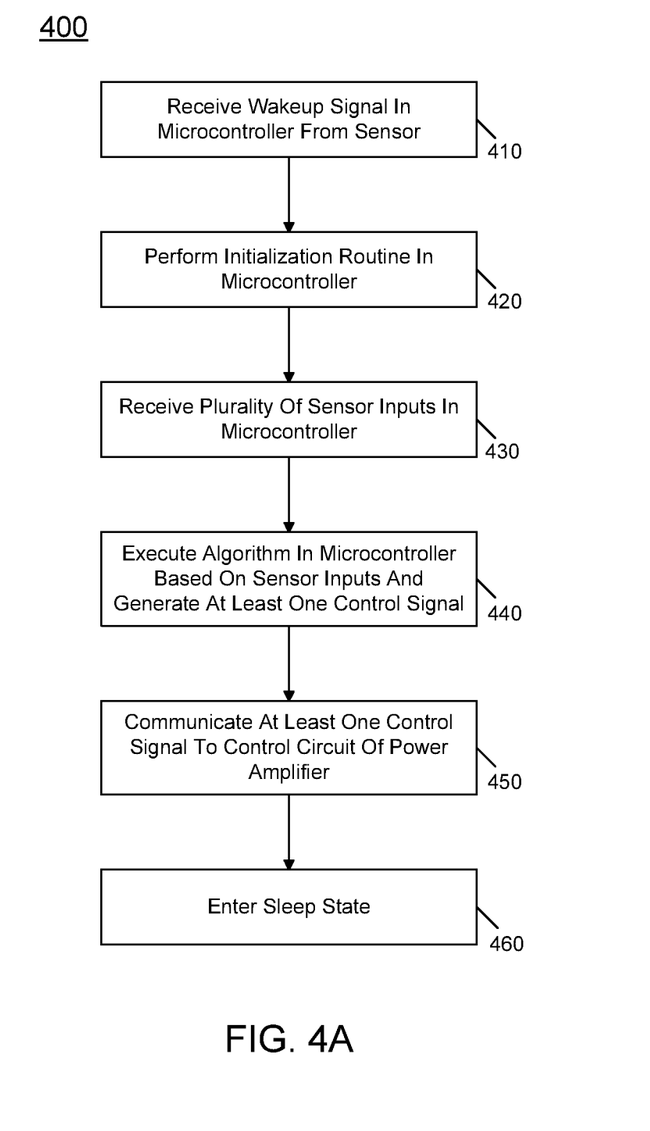
FIG. 4A is a flow diagram of a method for controlling a PA in accordance with an embodiment of the present invention.

Referring now to FIG. 4A, shown is a flow diagram of a method of controlling a PA in accordance with an embodiment of the present invention. As shown in FIG. 4A, method 400 may be performed in a PA including an on-board microcontroller and further where the microcontroller is configured to be in a low power or powered off state for much of the operation time of the PA, and configured to wake up responsive to a wake up signal. Of course, understand the scope of the present invention is not limited in this regard and in other implementations, the microcontroller may always be active, or may alternate between a low power state and an active state to periodically scan various information and perform its control operations accordingly.

As seen in FIG. 4A, method 400 begins by receiving a wake up signal in the microcontroller from a sensor (block 410). As an example, one or more sensors may be configured with programmable thresholds such that when a measured value crosses this programmable threshold, the sensor sends a wake up signal directly to the microcontroller. Understand that in addition, each of the sensors may further output the measured information to a selection mechanism such as a multiplexer that in turn is coupled to an ADC to enable the provision of digital information to the microcontroller.

Still referring to FIG. 4A, at block 420 an initialization routine may be performed in the microcontroller responsive to this wake up signal. In various embodiments, this initialization routine may enable the microcontroller to be placed in an initial state and be ready to receive incoming information. In the embodiment shown, the microcontroller may receive multiple sensor inputs (block 430). As one example, the microcontroller may be programmed to iteratively receive a sensor input from each of the sensors present in the PA and perform various processing operations such as placing the information in an appropriate format and storing it, e.g., temporarily in storages such as a table.

Next, control passes to block 440 where a multi-dimensional algorithm of an arbitrary transfer function, e.g., as determined based on characterization of an actual PA to determine behavior based on different operation parameters, may be executed. More specifically this algorithm may be a multi-dimensional algorithm to receive one or more of the sensor inputs and perform analysis on such inputs to generate at least one control signal to enable control of at least one component of the PA. Thus at block 450 the one or more control signals can be communicated to one or more control circuits of the PA. For example, for purposes of bias control one or more bits can be sent to a bias generation circuit that thus generates an appropriate bias signal based on this value. As another example, one or more of the gain stages may be controlled based on control signals provided to control inputs to the gain stages. By providing a microcontroller in accordance with an embodiment of the present invention, characteristics can be changed in nearly arbitrary fashion, rather than changes that can be realized with transistors in an analog circuit control. As one such example, a bias current provided to a gain stage can be made proportional to the hyperbolic tangent of a peak detect voltage.

As another example, with peak detectors coupled to different stages, values for a given setting can be determined. As such the microcontroller can change the tuning levels and analyze peak values to determine whether power goes up or down, and to identify whether operation is on the low side of the peak or the high side of the peak. From this information relative to factory tuning a determination of the input frequency can be made, and PA settings may be optimized for that frequency, resulting in fully optimized performance, reducing power consumption.

Peak voltage detectors and PFDs can also provide information to determine the load condition. For example, if the peak is very low or high on the output stage relative to the driver stage, this may be an indication of a mismatch load condition. The PFD output may be used to indicate the phase angle of the load. Peak voltage detectors can also be applied to the coupled ports of a directional coupler. The ratio of the various peak voltage detectors on the directional coupler ports may be an indication of a mismatch load condition. Current detectors in the regulators, combined with peak voltage detectors, may also be an indication of a mismatch load condition. In addition, current limits can be implemented with the microcontroller, by detecting an overcurrent condition, and reducing bias currents in various gain stages.

Still referring to FIG. 4A, after communication of these one or more control signals, the microcontroller may prepare itself for entry into a sleep state to enable both reduced power consumption and to avoid potential noise (block 460). Of course it is possible as described above that the microcontroller may be of a sufficiently low noise design that it may be able to continue to be powered during substantially all of the operations of the PA, in some embodiments.

Figure 4B:
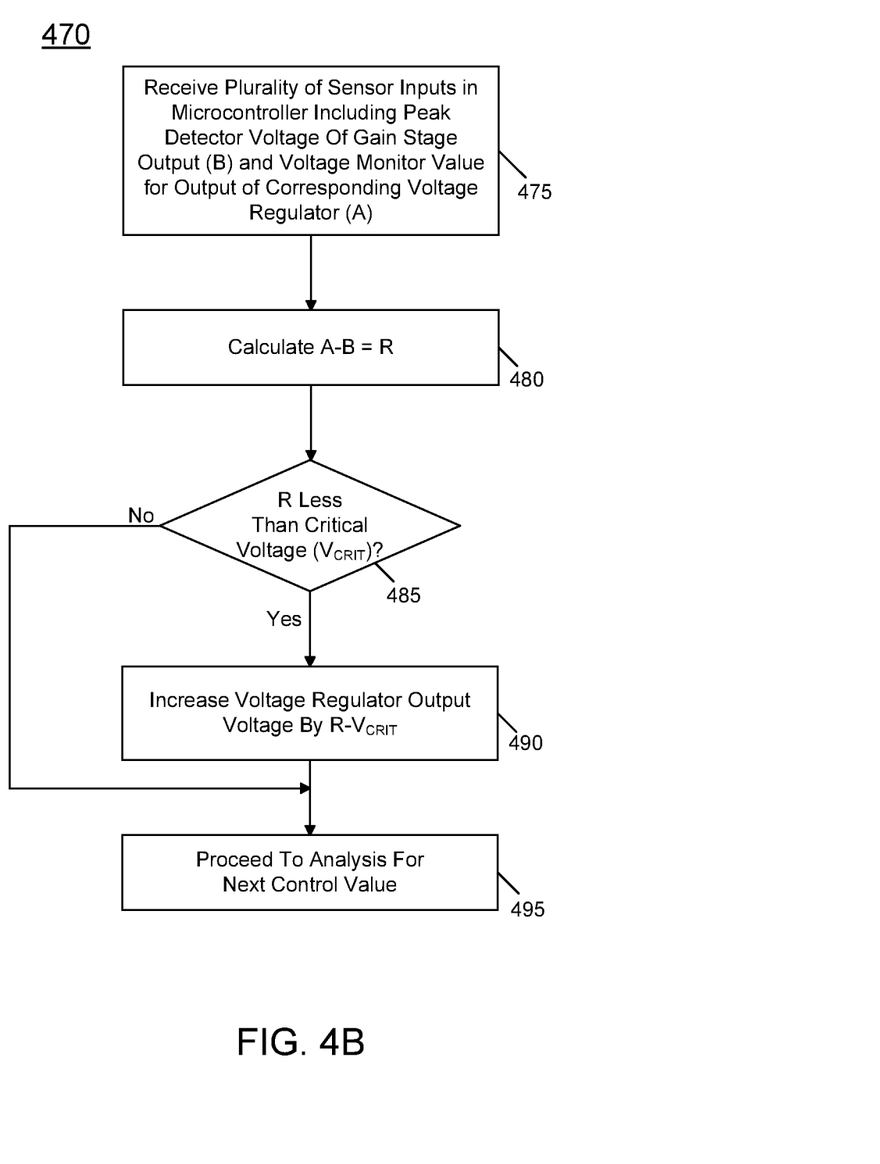
FIG. 4B is a flow diagram of a method for controlling a particular parameter in accordance with an embodiment of the present invention.

Referring now to FIG. 4B, shown is a flow diagram of a method of controlling a particular control value in accordance with an embodiment of the present invention. In the example shown in FIG. 4B, this control value may correspond to an output voltage from a voltage regulator coupled to a corresponding one of the gain stages of the PA. Similar operations can be performed for each such voltage regulator within the PA. In addition, understand that this method illustrates a single example of control signal generation such as discussed above at block 440 of FIG. 4A. Based on other incoming information from various sensors, additional control values can be generated and communicated in a single iteration of method 400 of FIG. 4A.

As illustrated in FIG. 4B, method 470, which may be performed by the microcontroller, can occur for each voltage regulator within the PA. As seen, at block 475 multiple sensor inputs can be received. For purposes of output voltage control from the voltage regulator, these inputs may correspond to a voltage detection value from a peak detector at an output of a given gain stage (referred to as value B) and a monitored voltage value for an output of the corresponding voltage regulator (referred to as value A). With reference back to FIG. 1, the gain stage output can be received via peak detector $130_0$, while the voltage regulator output can be measured at an output of voltage regulator $120_1$.

Next, at block 480 a value R can be determined based on these sensor values, that in the embodiment shown correspond to A-B. Next control passes to diamond 485 where it can be determined whether this calculated value R is less than a predetermined value, referred to herein as a critical voltage ($V_{crit}$). Although the scope of the present invention is not limited in this regard in an embodiment, this critical voltage may correspond to 0.25 volts. If it is determined that the calculated value R is less than this value control passes to block 490 where the regulated voltage output can be increased by a given amount. In the example shown, this voltage increase may correspond to the value of R-$V_{crit}$. In either event, from both diamond 485 and block 490 control passes next to block 495 where the algorithm can proceed to an analysis of a next control value, such as a control value for another voltage regulator or another controllable parameter of the PA. Although shown at this high level in the embodiment of FIG. 4B, understand the scope of the present invention is not limited in this regard.

Figure 5:
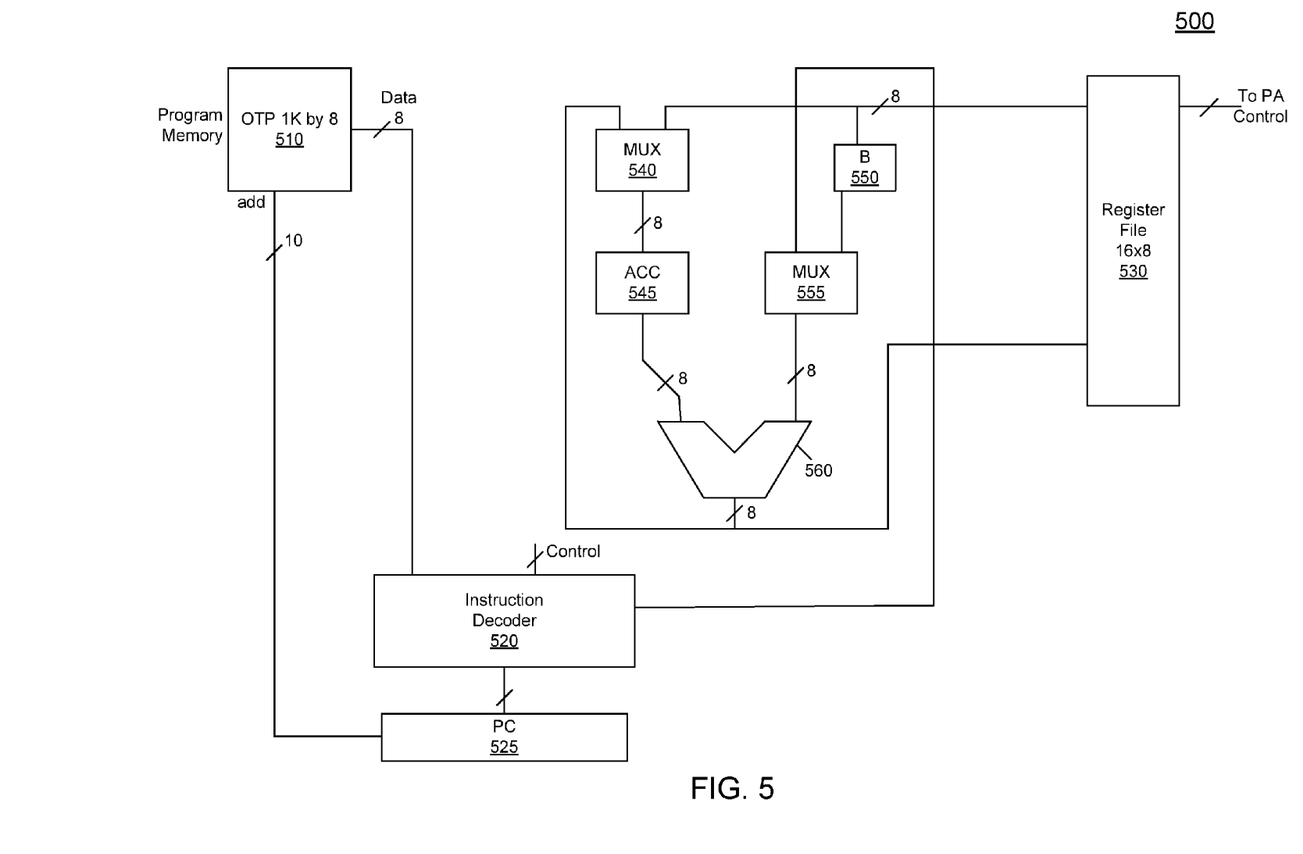
FIG. 5 is a block diagram of a custom microcontroller in accordance with an embodiment of the present invention.

As described above, in some embodiments a custom-designed microcontroller may be present. Referring now to FIG. 5, shown is a block diagram of a custom microcontroller in accordance with an embodiment of the present invention. As shown in FIG. 5, PA 500 may include an OTP memory 510 that stores program instructions and data.

Instructions can be provided to an instruction decoder 520 that is further coupled to a program counter 525 that provides address information to memory 510 to enable communication of desired instructions to the instruction decoder. As further seen, instruction decoder 520 is coupled to a data path. The data path includes a multiplexer 540 that can receive inputs from a register file 530 (which in an embodiment may include 16 registers each of eight bits). A selected output of multiplexer 540 may couple to a first input of an accumulator 545 that in turn is coupled to an arithmetic logic unit (ALU) 560. As further seen, the data path includes a storage 550 that is coupled to register file 530 and further is coupled via multiplexer 555 to a second input of ALU 560. The resulting output of the ALU may couple to multiplexer 540 as well as to register file 530.

When a given register includes a control value to be provided to a particular controllable element of the PA, the value in the register can be communicated to the corresponding controllable element. In an embodiment, 48 bits may be communicated as control signals to control various circuitry of the PA. As one illustration, some bits can be used to tune each stage, for example, a pre-driver stage a driver stage, and an output stage. Additional bits can be used to control the bias current for each stage. Although this particular type of custom microcontroller is shown in FIG. 5, understand the scope of the present invention is not limited in this regard and in other embodiments a conventional microcontroller such as an 8051-based microcontroller may be present.

Figure 6:
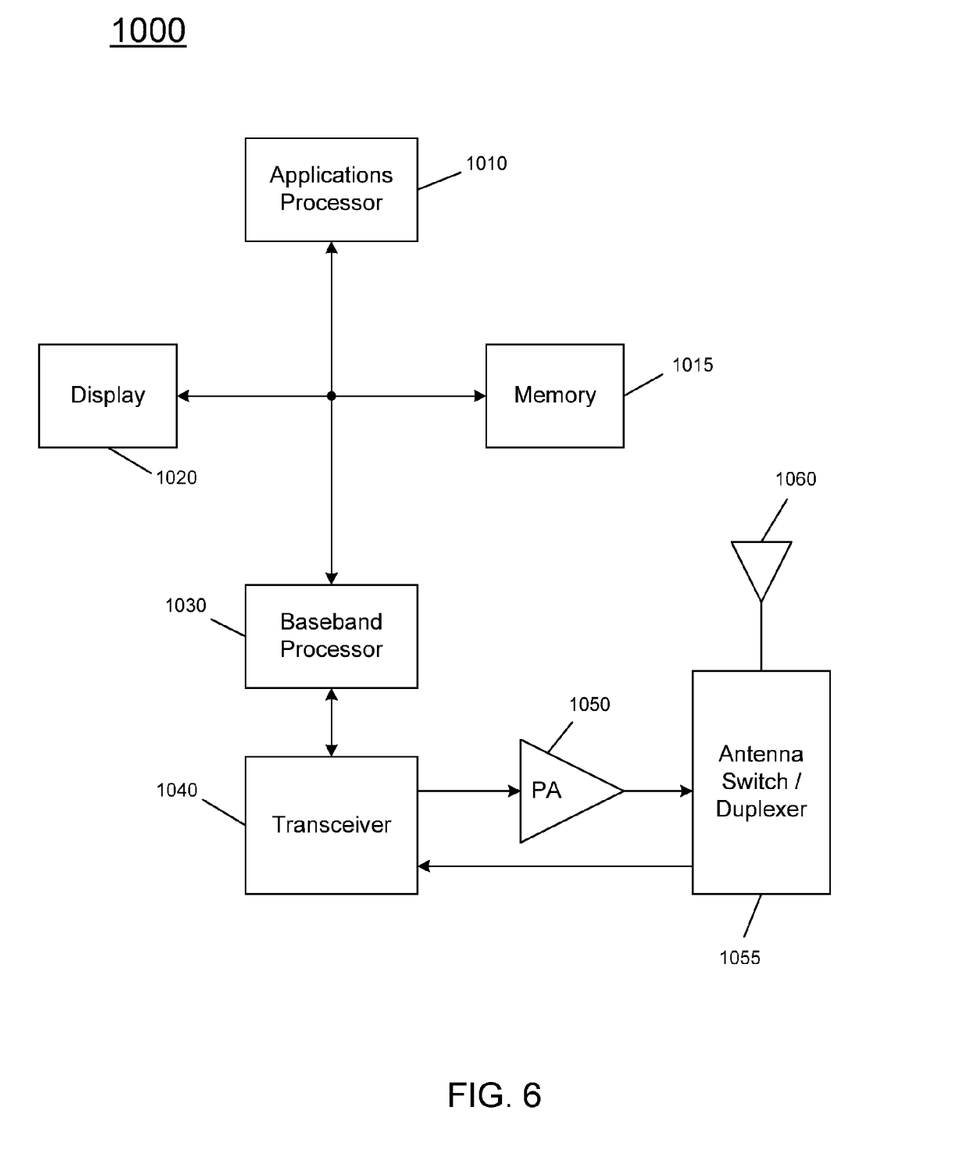
FIG. 6 is a block diagram of a wireless device in accordance with an embodiment of the present invention.

As described above, a PA such as a CMOS PA in accordance with an embodiment of the present invention can be implemented in many different device types. Such a device can be used in various wireless systems, including handsets, mobile devices, PDAs, tablets and so forth. Referring now to FIG. 6, shown is a block diagram of a wireless device 1000 in accordance with an embodiment of the present invention. As shown in FIG. 6, wireless device 1000 may include an applications processor 1010 which may be a microprocessor or other programmable logic to handle various system features, such as running application programs desired by a user. To perform its functions, applications processor 1010 may communicate with a memory 1015, which may be a flash memory or other non-volatile memory. Applications processor 1010 may further communicate with a display 1020, such as an LCD display of the system. For handling RF communications, e.g., wireless phone calls, wireless data transmissions and so forth, e.g., according to a communications protocol such as GSM/EDGE, W-CDMA, or LTE, applications processor 1010 may communicate with a baseband processor 1030, which may handle baseband operations both for transmit and receive paths. In turn, baseband processor 1030 is coupled to a transceiver 1040, which may receive incoming baseband signals from baseband processor 1030, and perform processing to upconvert the signals to RF levels for transmission to a PA 1050. PA 1050 may be a power amplifier in accordance with an embodiment of the present invention that includes an integrated microcontroller to dynamically control a variety of settings of the PA based on sensed information. In some embodiments, control information from baseband processor 1030 may be coupled through transceiver 1040 to PA 1050. In turn, PA 1050 may be coupled to an antenna switch, duplexer or both 1055 which in turn is coupled to an antenna 1060, which radiates the amplified RF signal (note in some embodiments, multiple antennas or other loads may be present).

As further shown in FIG. 6, in a receive path, antenna 1060 couples through antenna switch 1055 and possibly through the duplexer or SAW filters and then to transceiver 1040, which may demodulate the incoming RF signals back to baseband for transmission to baseband processor 1030 for further processing. While shown with this particular implementation in the embodiment of FIG. 6, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A power amplifier (PA) comprising:
    a signal processing path comprising a plurality of gain stages to receive a radio frequency (RF) signal and to output an amplified RF signal;
    a plurality of sensors coupled to the signal processing path, each of the plurality of sensors being configured to sense at least one characteristic of operation of the PA;
    a microcontroller comprising a memory configured to store instructions, the microcontroller being configured to: execute the instructions; receive the at least one operation characteristic; and control at least one parameter of the signal processing path responsive to the received at least one operation characteristic; and
    an integrated circuit (IC) comprising a single semiconductor die comprising the signal processing path and the microcontroller.

2. The power amplifier of claim 1, wherein the single semiconductor die comprises complimentary metal-oxide-semiconductor (CMOS) devices.

3. The power amplifier of claim 1, further comprising a one time programmable memory configured on the single semiconductor die to store the instructions.

4. The power amplifier of claim 1, further comprising a multiplexer coupled to the plurality of sensors, wherein the microcontroller is configured to cause the multiplexer to provide an output of one of the plurality of sensors to a digitizer, wherein the digitizer is configured to provide a digital value of the sensor output to the microcontroller.

5. The power amplifier of claim 1, wherein the microcontroller is configured to control a bias current for at least one of the plurality of gain stages in a non-linear manner.

6. The power amplifier of claim 1, wherein the plurality of sensors comprises a phase frequency detector coupled to the signal processing path and associated with one of the plurality of gain stages.

7. The power amplifier of claim 1, wherein the plurality of sensors includes a frequency counter coupled to the signal processing path and associated with one of the plurality of gain stages.

8. A method comprising:
    receiving, in a microcontroller of a power amplifier (PA), a wake up signal from a first sensor of the PA, the wake up signal to indicate that a sensed value sensed by the first sensor exceeds a threshold;

initializing the microcontroller responsive to the wake up signal;

receiving, in the microcontroller, sensor inputs from a plurality of sensors of the PA coupled to the microcontroller;

generating at least one control signal based on at least one of the sensor inputs;

communicating the at least one control signal to a control circuit of the PA to update a setting of a component of a signal processing path of the PA;

causing the microcontroller to enter a sleep state; and causing a multiplexer of the PA to provide an output of one of the plurality of sensors to a digitizer of the PA, wherein the digitizer is to provide a digital value of the sensor output to the microcontroller.

9. The method of claim 8, further comprising causing the microcontroller to exit the sleep state responsive to an interrupt signal received via a first input to the microcontroller.

10. The method of claim 9, wherein the interrupt signal is generated when the sensed value exceeds the threshold.

11. The method of claim 8, further comprising receiving in the microcontroller a first voltage value corresponding to an output voltage of a first voltage regulator of the PA and receiving in the microcontroller a second voltage value corresponding to an output voltage of a first gain stage of the PA.

12. The method of claim 11, further comprising comparing a difference of the first and second voltage values to a threshold value, and updating a digital control value provided to the first voltage regulator based on the comparison.

13. A system comprising:
a transceiver to receive data from a baseband processor and to process the data to output a radio frequency (RF) signal;
a power amplifier (PA) coupled to the transceiver to receive the RF signal and configured to output an amplified RF signal via a plurality of gain stages of the PA, the PA comprising:
a plurality of sensors, each of the plurality of sensors being configured to sense at least one characteristic of operation of the PA;
a microcontroller coupled to the plurality of sensors and configured to execute instructions, the microcontroller being configured to receive the at least one operation characteristic and to generate a plurality of digital control signals each to control at least one controllable element of the PA responsive to the received at least one operation characteristic; and
a matching network coupled between a first gain stage and a second gain stage of the plurality of gain stages, wherein the matching network is configured to receive at least one digital control signal from the microcontroller and to adjust an amount of capacitance of the matching network based thereon.

14. The system of claim 13, wherein the microcontroller is to receive a first voltage value corresponding to an output voltage of a first voltage regulator of the PA and receive a second voltage value corresponding to an output voltage of a first gain stage of the plurality of gain stages, compare a difference of the first and second voltage values to a threshold value, and update a first digital control value provided to the first voltage regulator based on the comparison.

15. The system of claim 14, wherein the updated first digital control value is to cause the output voltage of the first voltage regulator to increase if the difference is less than the threshold value.

16. The system of claim 13, wherein the PA comprises an integrated circuit (IC) having a single semiconductor die including the plurality of gain stages, the plurality of sensors and the microcontroller, wherein the single semiconductor die comprises complimentary metal-oxide-semiconductor (CMOS) devices.

17. The system of claim 13, wherein the PA further comprises a non-linearity compensation circuit to receive at least one digital control signal from the microcontroller and to adjust an amount of capacitance coupled to an input of a first gain stage of the plurality of gain stages based thereon.

18. A power amplifier (PA) comprising:
a signal processing path comprising a plurality of gain stages to receive a radio frequency (RF) signal and to output an amplified RF signal;
a plurality of sensors coupled to the signal processing path, each of the plurality of sensors being configured to sense at least one characteristic of operation of the PA, the plurality of sensors comprising a plurality of peak detectors each coupled to the signal processing path and associated with one of the plurality of gain stages; and
a microcontroller configured to: execute instructions; receive the at least one operation characteristic; and control at least one parameter of the signal processing path responsive to the received at least one operation characteristic, wherein the microcontroller is further configured to be in a sleep mode and to wake up responsive to receipt of a wake up signal from one of the plurality of sensors.

19. The power amplifier of claim 18, wherein the single semiconductor die comprises complimentary metal-oxide-semiconductor (CMOS) devices.

20. The power amplifier of claim 18, further comprising a one time programmable memory configured on the single semiconductor die to store the instructions.

21. The power amplifier of claim 18, wherein the microcontroller is configured to control a bias current for at least one of the plurality of gain stages in a non-linear manner.

22. The power amplifier of claim 18, wherein the plurality of sensors comprises a phase frequency detector coupled to the signal processing path and associated with one of the plurality of gain stages.

23. The power amplifier of claim 18, wherein the plurality of sensors comprises a frequency counter coupled to the signal processing path and associated with one of the plurality of gain stages.

24. The power amplifier of claim 18, wherein the PA comprises an integrated circuit (IC) having a single semiconductor die comprising the signal processing path and the microcontroller.

* * * * *